(12) United States Patent
Roberts et al.

(10) Patent No.: US 11,146,185 B2
(45) Date of Patent: Oct. 12, 2021

(54) SYSTEMS AND METHODS FOR GENERATING HIGH VOLTAGE PULSES

(71) Applicant: Radiance Technologies, Inc., Huntsville, AL (US)

(72) Inventors: Zach Roberts, Auburn, AL (US); Spencer Rendall, Daphne, AL (US); M. Frank Rose, Charlottesville, VA (US)

(73) Assignee: Radiance Technologies, Inc., Huntsville, AL (US)

(*) Notice: Subject to any disclaimer, the term of this patent is extended or adjusted under 35 U.S.C. 154(b) by 808 days.

(21) Appl. No.: 15/673,977

(22) Filed: Aug. 10, 2017

(65) Prior Publication Data

US 2017/0359004 A1 Dec. 14, 2017

Related U.S. Application Data

(63) Continuation of application No. 14/048,917, filed on Oct. 8, 2013, now Pat. No. 10,135,364.

(51) Int. Cl.
*H01L 41/113* (2006.01)
*H02N 2/18* (2006.01)
*H03K 3/57* (2006.01)

(52) U.S. Cl.
CPC .......... *H02N 2/181* (2013.01); *H01L 41/113* (2013.01); *H03K 3/57* (2013.01)

(58) Field of Classification Search
CPC ............. H01L 41/113; H01L 41/1132; H01L 41/1134; H01L 41/1136; H01L 41/1138; H01L 41/042

USPC .................................................. 310/317, 339
See application file for complete search history.

(56) References Cited

U.S. PATENT DOCUMENTS

| 3,337,758 | A | * | 8/1967 | Brothers | F42C 11/02 |
| | | | | | 310/319 |
| 6,995,496 | B1 | * | 2/2006 | Hagood, IV | H02N 2/181 |
| | | | | | 310/316.01 |
| 7,151,330 | B2 | | 12/2006 | Rose | |
| 7,560,855 | B2 | | 6/2009 | Baird et al. | |
| 7,999,445 | B2 | | 8/2011 | Baird et al. | |
| 2003/0034715 | A1 | | 2/2003 | Burns | |
| 2011/0006614 | A1 | * | 1/2011 | Baird | H03K 3/45 |
| | | | | | 307/106 |
| 2015/0097466 | A1 | | 4/2015 | Roberts et al. | |

OTHER PUBLICATIONS

Reynolds Industries, Inc., "Reynolds Industries Systems Incorporated Explosive Products," http://www.teledynereynolds.com/pdf/facil-part5.pdf.

* cited by examiner

*Primary Examiner* — Derek J Rosenau
(74) *Attorney, Agent, or Firm* — Maynard Cooper & Gale, P. C.; Jon E. Holland

(57) ABSTRACT

A high voltage pulse generating system has a latching element coupled in between a ferroelectric generator (FEG) and a load, such as a vector inversion generator. Such a latching element prevents the return of current to the FEG when the FEG undergoes mechanical destruction after depolarization, thereby increasing the useful amount of energy extracted from the FEG. In some embodiments, multiple FEGs are configured with multiple latching elements to deliver multiple high-voltage, high-current pulses.

8 Claims, 9 Drawing Sheets

| Ring FEGs in Tandem |||| 
|---|---|---|---|
| LOAD | | | |
| Capacitance (nF) | | 1.5E-08 | |
| Voltage (V) | FEG 1 + FEG 2 | 8000 | |
| | FEG 1 | 14000 | |
| Energy (J) | | 0.48 | 32.65% |
| | FEG 1 + FEG 2 | 1.47 | 67.35% |

*FIG. 9C*

SYSTEMS AND METHODS FOR GENERATING HIGH VOLTAGE PULSES

CROSS REFERENCE TO RELATED APPLICATION

This application is a continuation of and claims priority to U.S. patent application Ser. No. 14/048,917, entitled "Systems and Methods for Generating High Voltage Pulses" and filed on Oct. 8, 2013, which is incorporated herein by reference.

RELATED ART

Explosive ferroelectric generators (FEG) are useful for generating high voltage outputs and typically incorporate a detonator, an explosive material, such as C4, and a ferroelectric element. When the explosive material is detonated, the ferroelectric material becomes depolarized, resulting in a short high voltage, high current output pulse that may range, for example, between 10 KV to 100 KV. One known illustrative construction is shown in FIG. 1.

FIG. 1 shows a conventional FEG 100 having an enclosure 105 that may be constructed of polycarbonate or other plastic-type material, for example. Enclosure 105 contains a ferroelectric element 110 that is wired with electrodes 115 to an output load 120. Also, within the enclosure 105 resides explosive material 125, for example, military grade C4. A detonator 130 resides partly within the enclosure 105 for igniting the explosive material 125. A typical detonator 130 can be a blasting cap, which may be lit external to the enclosure 105.

The ferroelectric element 110 produces a net electric field throughout the material of the ferroelectric element 110. The electric field of ferroelectric element 110 holds energy that may be released from the ferroelectric element 110 when a phase change within the ferroelectric element 110 occurs. Once the detonator 130 ignites the explosive material 125, the ferroelectric element 110 undergoes a phase change and becomes "depolarized." Depolarization of the ferroelectric element 110 yields a shockwave of energy traveling from the ferroelectric element 110. The shockwave of energy can also be considered a "pulse of energy." The geometric shape of the ferroelectric element 110 will determine the effectiveness of the resulting shockwave upon depolarization of the ferroelectric element 110.

FIG. 1 shows a disk-shaped ferroelectric element 110. Such a disk-shaped ferroelectric element 110 yields a planar shockwave, i.e., a shockwave with little or no curvature. Likewise, a bar-shaped ferroelectric element 110 will also yield a planar shockwave or output pulse. An FEG's output pulse is proportional to the quantity of ferroelectric element under uniform pressure. Notably, disk and bar shaped ferroelectric elements yield less output pulse than a conic-shaped or cylindrical-shaped ferroelectric element, because the conic or cylindrical ferroelectric elements have a greater area for explosive material to exhibit its detonation velocity and angle.

As such, a conic or cylindrical shell for encasing the ferroelectric element generally results in a greater output pulse due primarily to favorable scaling in both radius and height of the cylinder or cone. The cylinder or cone may be constructed of a piezo ceramic, such as lead zirconate titanate (PZT), for example. FIG. 2 shows a conventional conic/cylindrical cut-away section of an FEG that allows large areas to be pressurized simultaneously.

FIG. 2 shows a conic/cylindrical cross-section 200 of an FEG 205. The conic/cylindrical cross-section 200 illustrates the internal area of the FEG 205. The internal area of the FEG 205 is simultaneously pressurized. An explosive element 210, when ignited or detonated, produces shockwaves 215 that are proportional to the quantity of explosive element 210 under uniform pressure. In the case where the explosive element 210 is packed in a cone shape, for example, the explosive element 210 may have a detonation velocity and detonation angle correlated to the cone. A resulting shockwave depolarizes the FEG 205, thereby releasing stored energy from FEG 205.

The release of large amounts of stored energy, resulting from a change in phase, caused by the depolarization of the FEG element 205, can be used to charge a load (not shown). The load may be either a resistive load or a capacitive load depending on the desired application. In one embodiment, the load is a capacitive load due to the coupling of a high voltage pulse generator to the FEG element 205. The high voltage pulse generator may be a vector inversion generator (VIG), for example; but need not be limited as such. When the VIG receives the stored energy from the depolarized FEG element 205 it will initially act like a capacitor holding the stored energy until a discharge is caused. Thus, the VIG is charged with energy from the depolarization of the FEG element 205. Afterwards, an activation of a primary switch in a circuit that includes an FEG element and a VIG can cause the VIG to generate a high-voltage output pulse of tens to hundreds of kilovolts. In one illustrative scenario, a two microsecond pulse from a depolarized FEG 205 generates a 30 KV output to a coupled VIG. The VIG in turn, upon a switch event from a primary switch, emits a 300 KV output pulse.

However, the depolarization of FEG 205 also causes the FEG 205 to rapidly deteriorate mechanically, especially where the FEG 205 is constructed of a crystalline or ceramic structure. Persons well skilled in the art of FEG design know that there are two timed events that impact a configuration comprising an FEG coupled with a VIG. The first event is the depolarization of the FEG caused by the detonation of the explosive element. The second event may occur within about a few microseconds or less; the FEG is mechanically destroyed or at least fractured. Thus, any useful extraction of energy from the FEG should, preferably, occur within a short time period, (e.g., 100 microseconds or less) after depolarization of the FEG and before the FEG begins behaving as a short circuit.

Past conventional solutions, from FEG designers, have attempted to time the events, but in doing so, the amount of a single output pulse from the coupled VIG is severely limited to only a few nanoseconds before the FEG is permanently destroyed.

BRIEF DESCRIPTION OF DRAWINGS

The disclosure can be better understood with reference to the following drawings. The elements of the drawings are not necessarily to scale relative to each other, emphasis instead being placed upon clearly illustrating the principles of the disclosure. Furthermore, like reference numerals designate corresponding parts throughout the several views.

FIG. 9C illustrates a tabulated example amount of voltage and energy for the configuration of FIG. 9A.

DETAILED DESCRIPTION

The present disclosure generally pertains to systems and methods for generating high-voltage pulses. In one embodiment, a system has a latching element coupled in between an FEG and a connected load to prevent the return of current to the FEG when the FEG fractures after depolarization, thereby increasing the useful amount of energy extracted from the FEG. In some embodiments, multiple FEGs are configured with multiple latching elements to deliver multiple high-voltages, high-current pulses.

Figure 1:
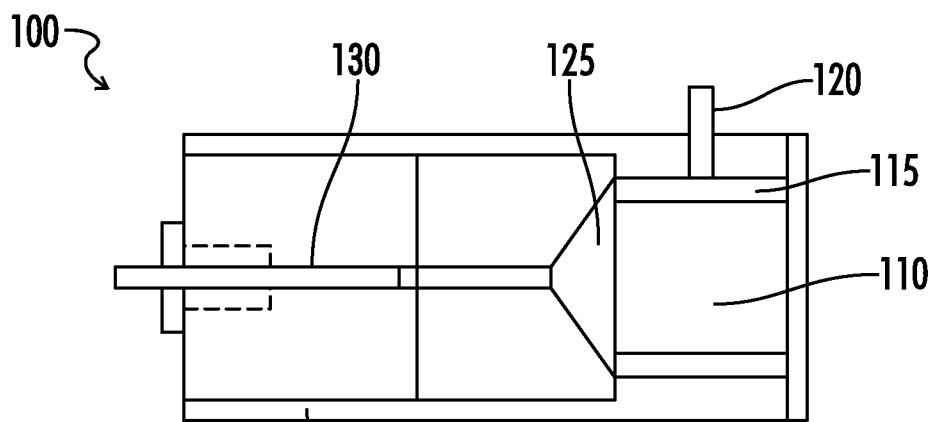
FIG. 1 is a pictorial diagram illustrating a conventional ferroelectric generator (FEG) in accordance with one or more embodiments of the present disclosure.
Figure 2:
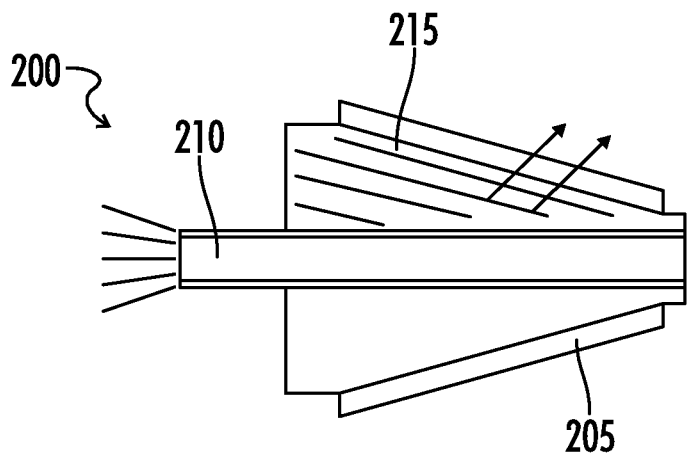
FIG. 2 is a cross-sectional diagram illustrating internal components for the FEG of FIG. 1.
Figure 3:
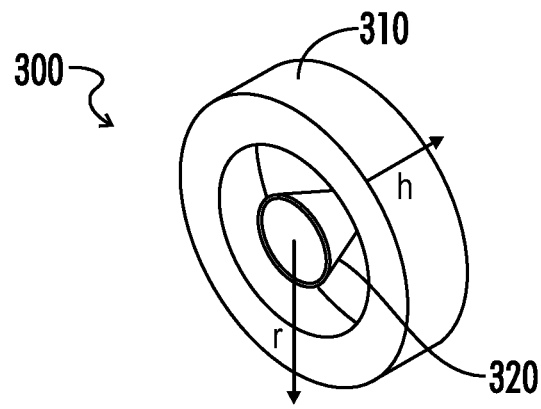
FIG. 3 depicts a conventional FEG constructed as a ring FEG.

FIG. 3 shows an FEG constructed as a ring. The FEG ring 300 comprises a circular FEG 310 encasing a conical explosive structure 320. The explosive material may be packed in this cone-shaped structure 320. The cone shape of the structure 320 matches the detonation velocity and angle of exploding material. Upon detonation, a planar shockwave emanates violently away from the conical explosive structure 320 causing the FEG ring 310 to depolarize. The depolarization of the FEG ring 310 changes the phase of the FEG material; thereby causing the FEG ring 310 to release energy in the form of an electric pulse.

The surface area of the conical explosive structure 320 is r×h; where r is the base radius and h is the height of the cone. The FEG ring 300 allows for a large volume of explosive element to be packaged in a compact geometry. For example, a 2"×0.5"×0.5" ring has approximately the same volume (i.e., 1.18 in$^3$) as a 4.75"×0.5"×0.5" bar stock (i.e., 1.18 in$^3$). The FEG ring 300 is contemplated to be useful in various sizes and therefore is not limited by the above described example.

Inherently, the FEG ring 310 is subject to a cracking event or mechanical fracture, after the initial depolarization of FEG ring 310. Several tests indicate that the cracking event often occurs at less than about 10 microseconds. Upon the FEG ring 310 cracking, the FEG becomes useless as a charging agent for the load (whether the load is capacitive or resistive) in that there is a severe loss of charge potential or stored energy between the outside electrode and inside electrode of the FEG ring 310, due to fracture of the crystalline structure and the mechanical destruction of the FEG ring 310. In fact, the FEG ring 310 will begin behaving as a short circuit due to its fracture, and the unused released FEG energy will flow back into the fractured FEG ring 310. Consequently, there can be a substantial loss of FEG energy available to the load. Accordingly, designers carefully design the time of energy extraction to ensure that it occurs in the small window from FEG depolarization to FEG fracturing.

Figure 4A:
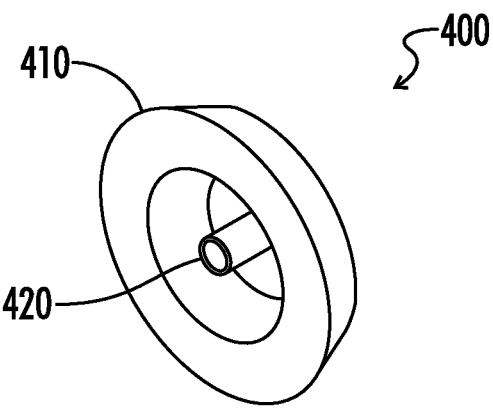
FIG. 4A is a conventional FEG constructed as a conical FEG.

Another FEG structure is shown in FIG. 4A. An FEG conical structure 400 comprises a cone FEG 410 encasing a cylindrical explosive structure 420 (also referred to as a tubular structure). The surface area of the implementation of the cylindrical explosive structure 420 is r×h; where r is the base radius and h is the height of the cylinder. Therefore, a large volume of active PZT element can be packaged in a compact geometry. However, the FEG cone 410 is also subject to a cracking event or mechanical destruction at less than about 5 microseconds, for example, after depolarization. In fact, unused released FEG energy can return to the fractured FEG cone 410, because after fracture, the FEG cone 410 begins behaving as a short circuit. Accordingly, there can be a substantial loss of FEG energy available to a load. Accordingly, designers carefully design the time of energy extraction to ensure that it occurs in the small window from FEG depolarization to FEG fracturing. The conventional approach to estimating when the FEG releases its stored energy and how soon thereafter the FEG is mechanically destroyed involves several steps including, the following: (1) detonate the FEG; (2) charge a coupled capacitor with the energy from the FEG; and (3) rapidly extract energy from the coupled capacitor for subsequent application usage, like as an RF signal interrupter or a light bulb's source of energy, before the FEG cracks or becomes a short.

The typical FEG charge is a 2 μsec ($10^{-6}$) pulse. The typical RF burst, from a connected high voltage pulse generator, is a 20 nanosecond ($10^{-9}$) pulse. A typical time for a crack in either the FEG ring structure 300 or the FEG conical structure 400 is at less than about 5 μsecs. Therefore, there is only a very short window after detonation of the blasting cap before the FEG structure cracks and experiences a severe loss of potential energy. Accordingly, a long-felt need by FEG designers has existed to try to control the depolarization of the FEG (which is subject to two different time scale events) in order to utilize its stored energy for a greater length of time.

Figure 4B:
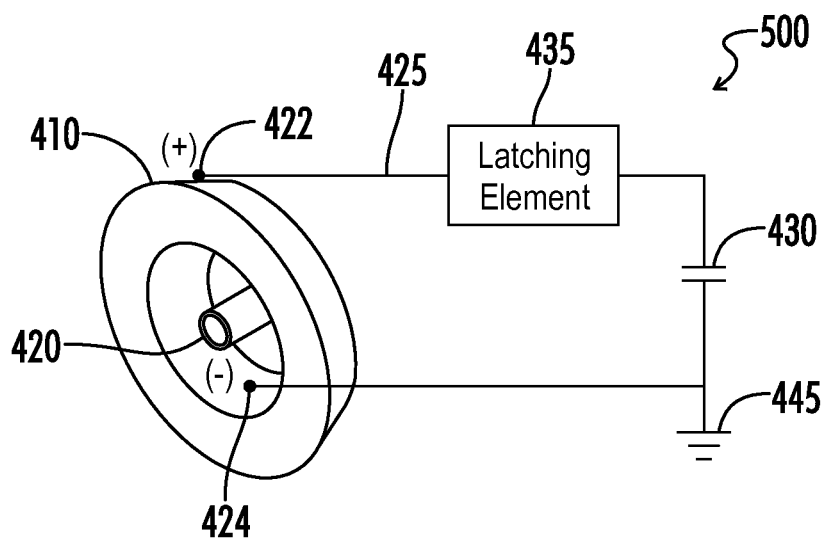
FIG. 4B is a pictorial diagram illustrating a system that employs a conical FEG with a latching element.

FIG. 4B shows a system 500 that couples a cone FEG 410, surrounding a cylindrical explosive structure 420, with a circuit 425 that has a capacitive load 430. Circuit 425 is connected to the cone FEG with electrodes 422 and 424. Electrode 422, in the illustrated example, is connected to the outer portion of cone FEG 410, which in one embodiment is a positive terminal of the FEG 410. Electrode 424 is connected to the inner portion of cone FEG 410, which in one embodiment is a negative terminal of the FEG 410. Upon depolarization of the cone FEG 410, a potential or voltage will exist between the electrodes (422, 424). Typically, the voltage and/or stored energy from the cone FEG 410 would be lost after a few microseconds, for example. However, the circuit 425 includes a latching element 435 connected to the positive terminal of cone FEG 410. The latching element 435 latches nearly all or a substantial amount of the released energy, from the depolarized cone FEG 410, into a connected capacitive load 430; and prevents current from returning to the cone FEG 410. Therefore, because of the latching element 435, substantially no energy from the cone FEG 410 is lost, even though the cone FEG 410 is ultimately mechanically destroyed. As such, the capacitive load 430 is charged with substantially all of the released energy from cone FEG 410; therefore, having available energy for a subsequent application purpose. A ground 445 connected to the capacitive load 430 completes the circuit 425.

The function of the latching element 435 enables the energy released from the cone FEG 410 to be latched into the load, such as a VIG, for example, for subsequent controlled use. In another application, the load may be a laser. Thus, the load may be either capacitive or resistive. A short sequence of steps illustrates the latching of the energy from the cone FEG 410. (1) The blasting cap detonates the cylindrical explosive structure 420. (2) The cone FEG 410 is depolarized and begins to release stored energy. (3) The stored energy is immediately latched into a connected load, such as capacitive load 430, for example. No return current to the cone FEG 410 is allowed by the latching element 435. (4) The cone FEG 410 begins to rapidly degrade, experiencing one or more structural cracks, as degradation continues, the leads to circuit 425 are ripped out of cone FEG 419, thus causing "de-tethering" of the cone FEG 410. (5) The cone FEG 410 begins to rapidly degrade, experiencing one or more structural cracks, as degradation continues, the leads to circuit 425 are ripped out of cone FEG 419, thus causing "de-tethering" of the cone FEG 410.

Figure 5A:
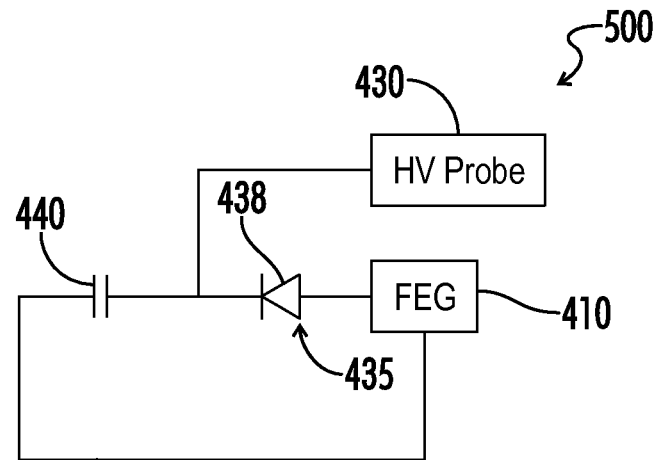
FIG. 5A is a block diagram illustrating an example high voltage generating system with a specific latching element.
Figure 5B:
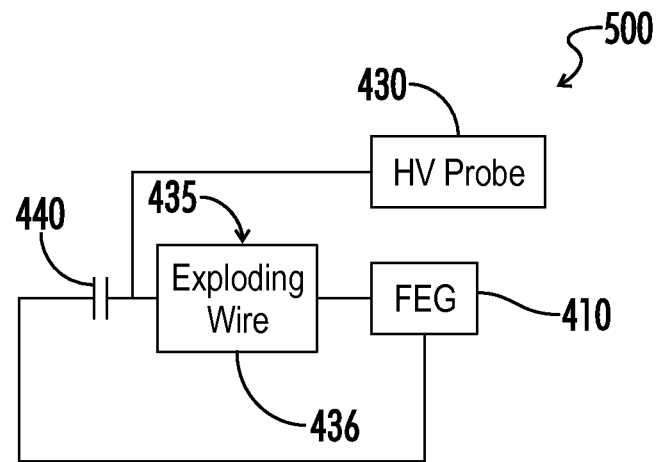
FIG. 5B is a block diagram illustrating an example high voltage generating system with an alternative latching element.
Figure 5C:
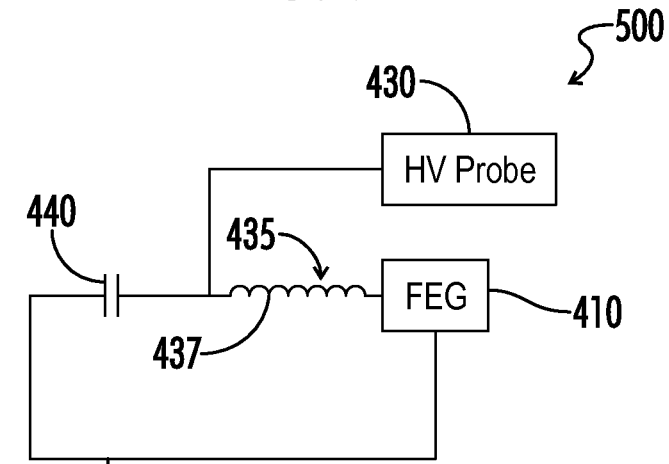
FIG. 5C is a block diagram illustrating an example high voltage generating system with yet another alternative latching element.

FIGS. 5A-5C depict alternative block diagrams of the system 500. Thus, the circuit 425 is shown, including the FEG 410 coupled to the latching element 435 and capacitive load 440. A high voltage probe 430 is positioned in the circuit 425 between the latching element 435 and capacitive load 440 in order to measure the released energy from FEG 410 available to the capacitive load 440 because of the latching element 435 conducting the large amount of current from FEG 410. The latching element 435 isolates the FEG 410, in only one direction, by preventing a return of current and energy to the FEG 410 after the FEG 410 is mechanically degraded. In FIG. 5A, the latching element 435 is implemented as a diode 438. Element 438 could also be any solid state switching device, such as a silicon controlled rectifier (SCR), an insulated-gate bipolar transistor (IGBT), or a field effect transistor (FET) that is capable of handling the rated current and voltage of the system.

In one embodiment, the diode 438 has voltage rating and current rating less than expected for voltage and current induced by the flow of energy from the FEG 410 to the capacitive load 440. Indeed, the diode 438 may be driven by at least 3 orders of magnitude beyond its current rated capability. For example, when the latching element 435 is a diode and is coupled to FEG 410 (as shown in FIGS. 4B and 5) the amount of voltage released from FEG 410 and used for charging the capacitive load 440 can be measured by the high voltage probe 430 in FIG. 5 as 36,000V at 10 kA. However, the diode 438 may only be rated for a much lower voltage or current, such as 8000V to 36,000V at 100 A.

It has been found that such a diode can indeed pass the large amounts of current that may be outputted from the FEG 410, such as 10 kA, for a short time. In this regard, the typical rating for a conventional diode is specified for the diode functioning in a continuous duty cycle, i.e., passing current continuously. However, the FEG 410 may only emit a very short microsecond pulse in the range of 2 μsecs, for example. Therefore, the latching diode 435 need only pass the current from the FEG 410 during the time that the FEG 410 is emitting a pulse. Accordingly, the typical diode is contemplated as providing latching means, because the diode 438 prevents the current passing through it from returning to the cone FEG 410.

After the FEG 410 fractures, current passing through the diode, from the FEG 410, quickly dissipates. Thus, a conventional diode, when electronically connected to an FEG, may be able to withstand or sustain 3 orders of magnitude or more beyond its rated capability for several hundred microseconds or longer, thereby allowing substantially all of the FEG energy to be captured after the FEG 410 mechanically degrades.

The above discussion has detailed the use of a conventional diode functioning as a latching element 435 beyond its rated capability. In other embodiments, a diode that is rated for extremely high voltage and high current is possible. However, such a diode might be cost prohibitive or difficult to implement in a practical way for some applications, such as within a mobile high pulse generator unit. Moreover, yet another type of latching element 435 may be employed in other embodiments.

For example, an exploding wire 436, depicted in FIG. 5B, may also function as latching element 435. A metal wire may pass an amount of current for which it is rated. As the current passing through the wire increases, the temperature of the wire generally increases proportionally. When the amount of current exceeds a threshold (e.g., about 3 orders of magnitude larger than the wire's current rating), the metal wire will vaporize and become plasma. To use the exploding wire 436 as the latching element 435, it may be desirable for the wire to be packed in sand to absorb the energy from the FEG 410. Nevertheless, using an exploding wire 436 as latching element 435 may allow capture of much of the energy from the FEG 410 by isolating the FEG 410 from the load, close to the time of fracture of the FEG 410.

In general, the exploding wire 436 is connected between the load and the FEG 410. The FEG 410 depolarizes subject to detonation of its explosive structure. Large amounts of current flows rapidly through the exploding wire 436 from the depolarized FEG 410. Consequently, the energy from the FEG 410 is sent to the capacitive load 430 throught the exploding wire 436 before the FEG 410 cracks; thus the energy is "latched" into the capacitive load 430. The current heats the exploding wire 436 to the point where it vaporizes. Subsequently, the exploding wire 436 vaporizes, causing an open circuit, and preventing current returning to the FEG 410.

Practically, some energy from the FEG 410 will be needed to vaporize the exploding wire 436, thereby reducing the total energy received by the load. Some designers, previously, have sized the exploding wire 436 significantly below the output pulse of the FEG 410, so some FEG energy has been lost as a result. The possibility remains that the exploding wire 436 will vaporize prematurely before all of the energy from the FEG 410 could be extracted. Accordingly, the diode 438 is preferable to the exploding wire 436, because the diode 438 enables substantially all of the released FEG energy from FEG 410 to be transferred to the capacitive load 440.

Fabrication of the exploding wire 436 is also costly in that industry-standard exploding wire is typically handmade and braided. The typical exploding wire is manufactured of gold and may be as large as 200 gauge. Accordingly, there is a substantial size difference between a diode 438 and a suitable sized explosive wire 436. For example, a diode 438 may be the size of a pen cap for a conventional writing marker. Whereas, the properly-sized explosive wire 436 may be approximately the size of a two-liter beverage bottle, which is at least an order of magnitude larger than the diode. Therefore, the geometry of the high energy system can be impacted by usage of the explosive wire 436, as well as the charging efficiency on a load.

Another contemplated latching element 435 may be a blocking inductor 437, depicted in FIG. 5C. The blocking inductor 437 may be sized to pass the rise time of the FEG pulse, which correlates to the shockwave velocity propagation as a frequency signal. Simplistically, the impedance of the blocking inductor 437 may allow a certain frequency band to pass (e.g., 100 MHz), while blocking frequencies outside of this band (e.g., 1 GHz). As indicated above, after the depolarization of an electrically connected FEG, it is only a matter of time before the crystal structure of the FEG shatters. Use of the blocking inductor 437 will at least temporarily prevent current from flowing back to the shattered crystal structure of the FEG. However, some conduction may occur later, and the blocking inductor 437 will not infinitely prevent energy loss back through the FEG.

Figure 6:
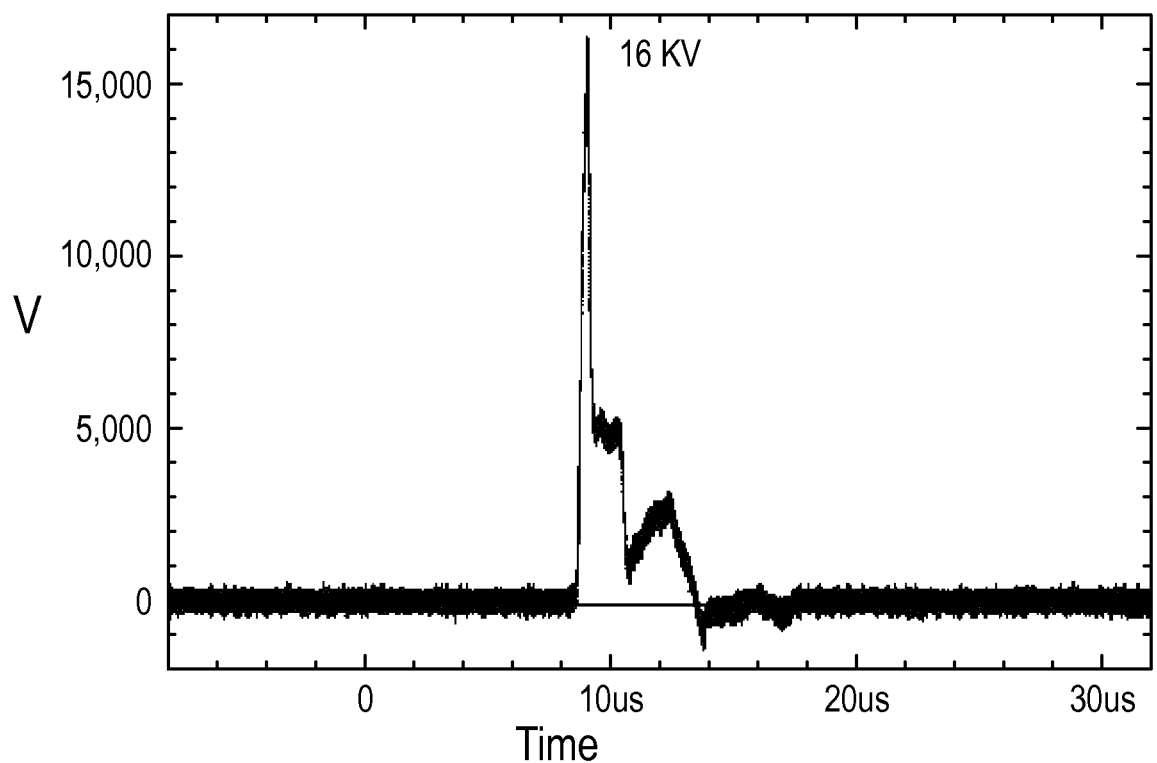
FIG. 6 is a graphical depiction of test results from a depolarized ring FEG.

FIG. 6 depicts a test of a ring FEG as it is depolarized. One can see the large amount of energy for a short period of time and also the resulting loss of energy as time elapses. This loss of energy is due to the mechanical degradation of the structure of the ring FEG. For example, the ring FEG may crack several microseconds after the large pulse of energy, and a crack in the FEG will cause severe loss of potential energy from the ring FEG. Before cracking, some ring FEGs may yield open circuit voltages greater than 60 KV and energies equal to or about 10 joules as an output pulse, for example.

The output pulse of the ring FEG may be proportional to the outside diameter of the ring FEG. Alternatively, the thickness of the ring FEG may be varied to affect the charge to a capacitive load. For example, reducing the ring FEG's thickness by half and configuring it to have 4× the capacitance at half the output voltage would enable charging the capacitive load at a higher efficiency.

Figure 7:
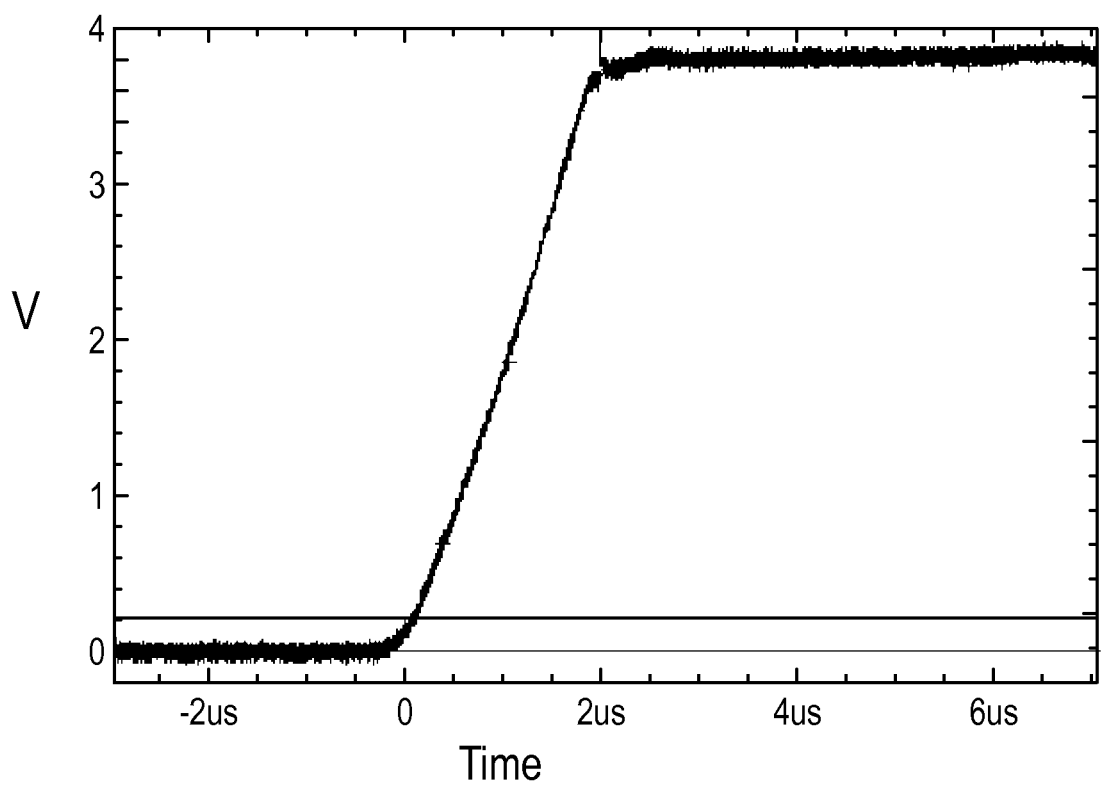
FIG. 7 is a graphical depiction of a shockwave resulting from depolarization of an FEG under field conditions.

FIG. 7 depicts a wave form that resulted from an explosive test under field conditions. As can be seen, a large amount of charging capacitance is available to a capacitive load when the FEG is latched into the capacitive load by a diode, for example. Based on modeling, a ring FEG should charge a 4 nanoFarad (nF) load to FEG open circuit voltages of greater than about 60 KV. Accordingly, the implementation may be considered highly reliable with a high energy density as seen in FIG. 7.

Figure 8A:
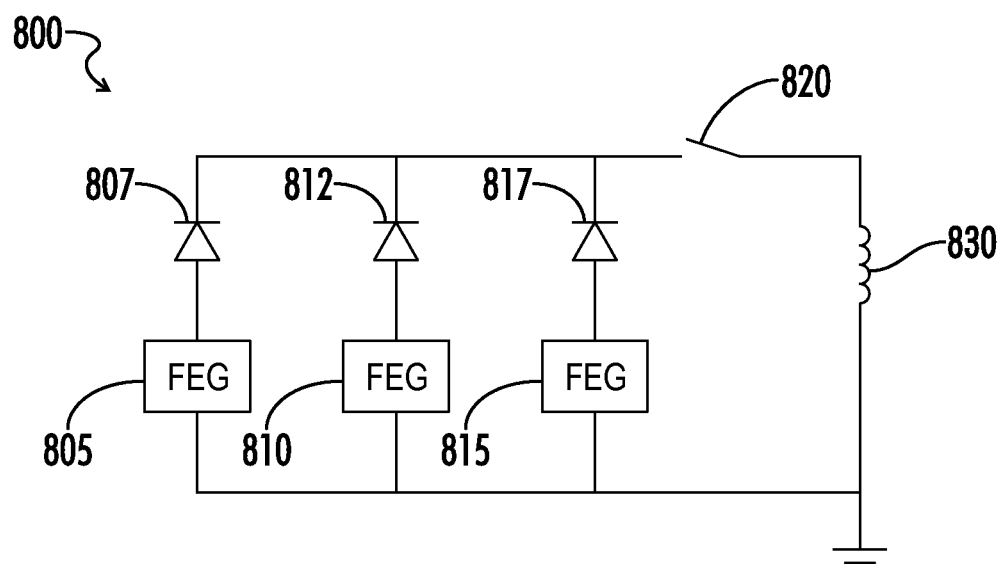
FIG. 8A is a block diagram depicting multiple configured FEGs with a capacitive load.

In another embodiment, multiple FEGs may be configured to share a common explosive train. FIG. 8A depicts three FEGs in arrangement 800. FEG 805 is connected to diode 807 and FEG 810 is coupled to diode 812. The two FEGs are both coupled to FEG 815, which is latched with diode 817. Each of the diodes are commonly connected prior to a switch 820 that when closed will enable a resistive load 830, such as a coil, to be charged with the multiple pulses from FEG 805, FEG 810, and FEG 815. Previously, it was problematic to use more than one FEG tied to a common source or load, because of the early fracture of initial FEGs in an arrangement of multiple FEGs. The depicted multiple FEGS in FIG. 8A are arranged to operate at predetermined intervals to produce multiple pulses for the resistive load 830. Thus, FEG 805 may fire first before FEG 810 and FEG 812. Sequential firing of the FEGs in a predetermined order and time interval will yield multiple sequential output pulses for charging the load, for example. In some embodiments, the FEGs may be used to seed a coil as depicted, and may be referred to as a flux compression generator.

Figure 8B:
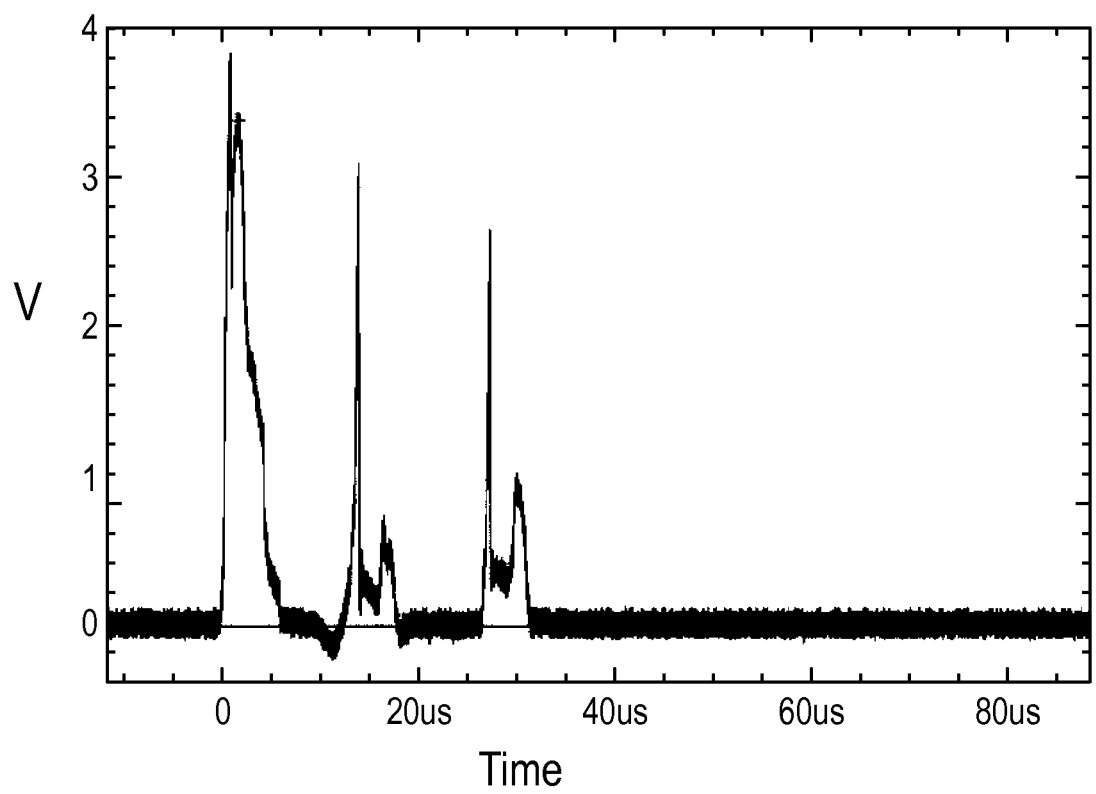
FIG. 8B is a graphical depiction of a multi-pulse FEG output for a resistive load.

FIG. 8B shows the resulting multiple high-voltage pulses from the arrangement 800. For the illustrative demonstration, captured by FIG. 8B, the explosive train was arranged to enable FEG 805, FEG 810, and FEG 815 to operate at 10 microsecond intervals. Clearly, other intervals may be chosen, as well as other number of FEGs may be configured to fire the series of output pulses.

Figure 9A:
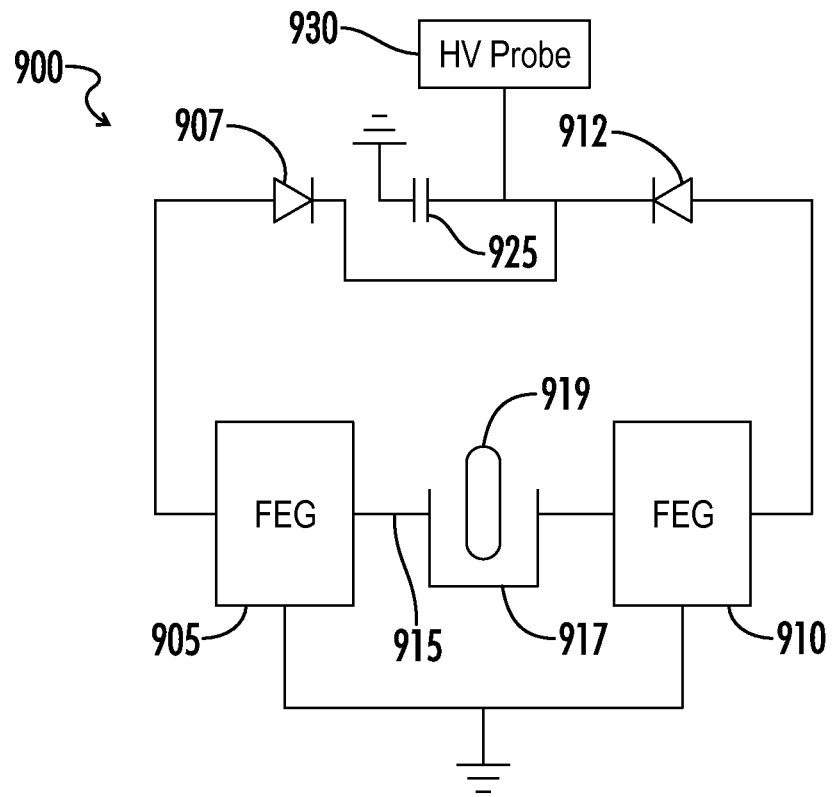
FIG. 9A is a block diagram depicting multiple configured FEGs sharing a common explosive train.

Alternatively, multiple ring FEGs, for example, may operate in tandem or parallel, with diode latching, to charge a capacitive load. FIG. 9A depicts a tandem configuration 900 in an electrical schematic. FEG 905 and FEG 910 share a common explosive train 915. The common explosive train 915 may be detonated by detonator 917 via the lighting of a blasting cap 919. Each FEG is latched by a connected diode. That is, FEG 905 is connected to latching diode 907, and FEG 910 is connected to latching diode 912. Each latching diode is also connected to a capacitive load 925. The latching diodes enable charging of the capacitive load with the release of energy emanating from FEG 905 and FEG 906 once they become depolarized as a result of the common explosive train 915 detonating. The energy released by FEG 905 and FEG 910, before they are mechanically degraded (i.e., a fractured crystal structure), can efficiently charge capacitive load 925, especially when compared to a single connected FEG. A high voltage probe 930 can measure the amount of voltage at the capacitive load 925. Thus, FIG. 9A shows, by way of example, a means to latch multiple FEGs into a load, such as a capacitive load 925. A test was conducted with two ring FEGs connected as shown in FIG. 9A.

Figure 9B:
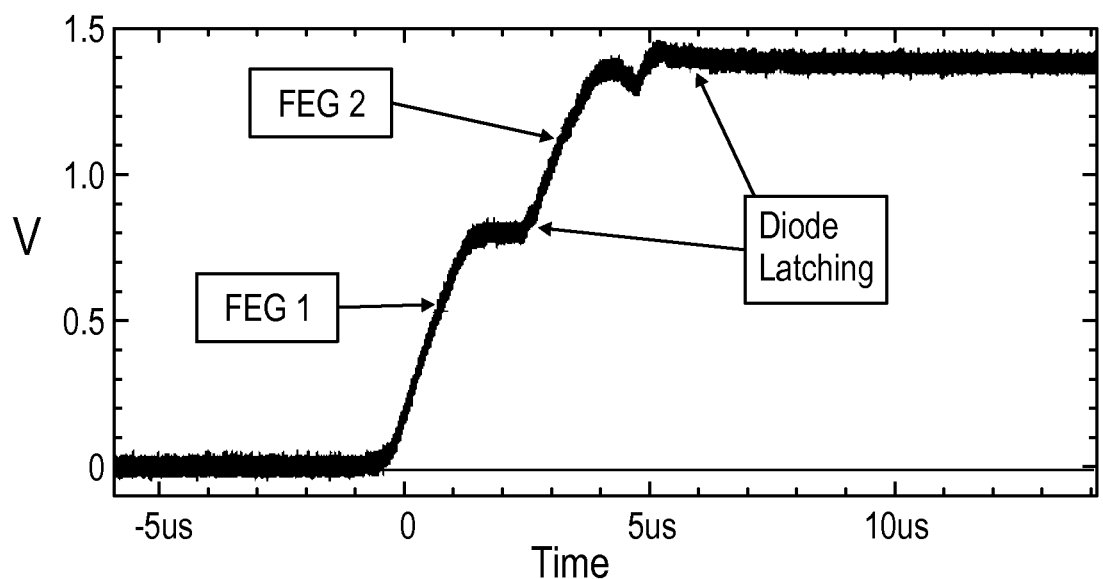
FIG. 9B graphically depicts an example output voltage over time available from the configuration of FIG. 9A.

FIG. 9B illustrates the high voltage rise of two tandem ring FEGs and the diode latching mechanism to charge a 15 nF capacitor to 14 KV. Accordingly, successive FEGs transfer energy with greater efficiency than a single FEG due to higher voltages being available. This efficiency is further seen in FIG. 9C, where a table shows a comparison of tandem FEGs to a single FEG with respect to voltage and energy efficiency. As expected, two FEGs yield greater voltage and higher energy, and they do so at a greater efficiency than a single FEG. The table in FIG. 9C shows the dual FEGs at approximately 67% efficiency versus approximately 33% efficiency for a single FEG.

Figure 10A:
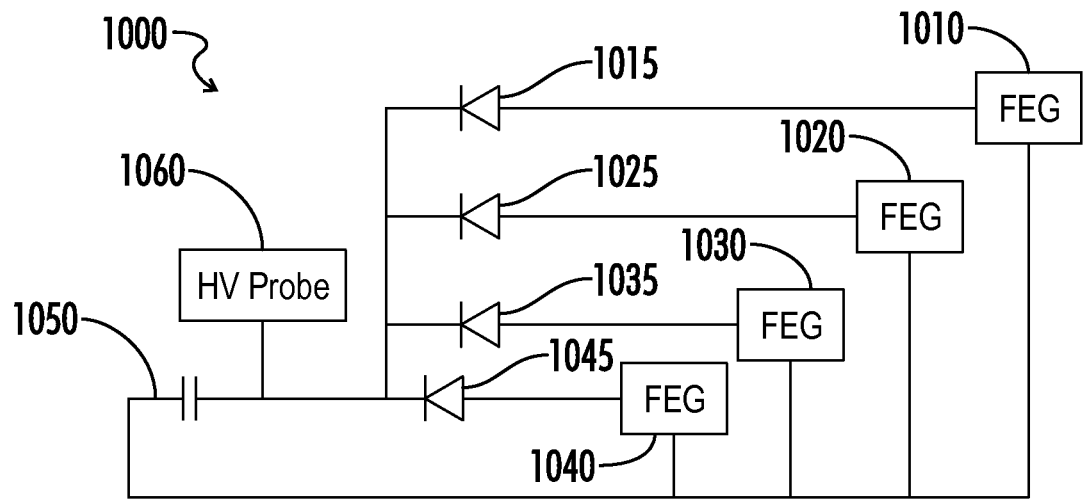
FIG. 10A is a block diagram depicting multiple configured FEGs.
Figure 10B:
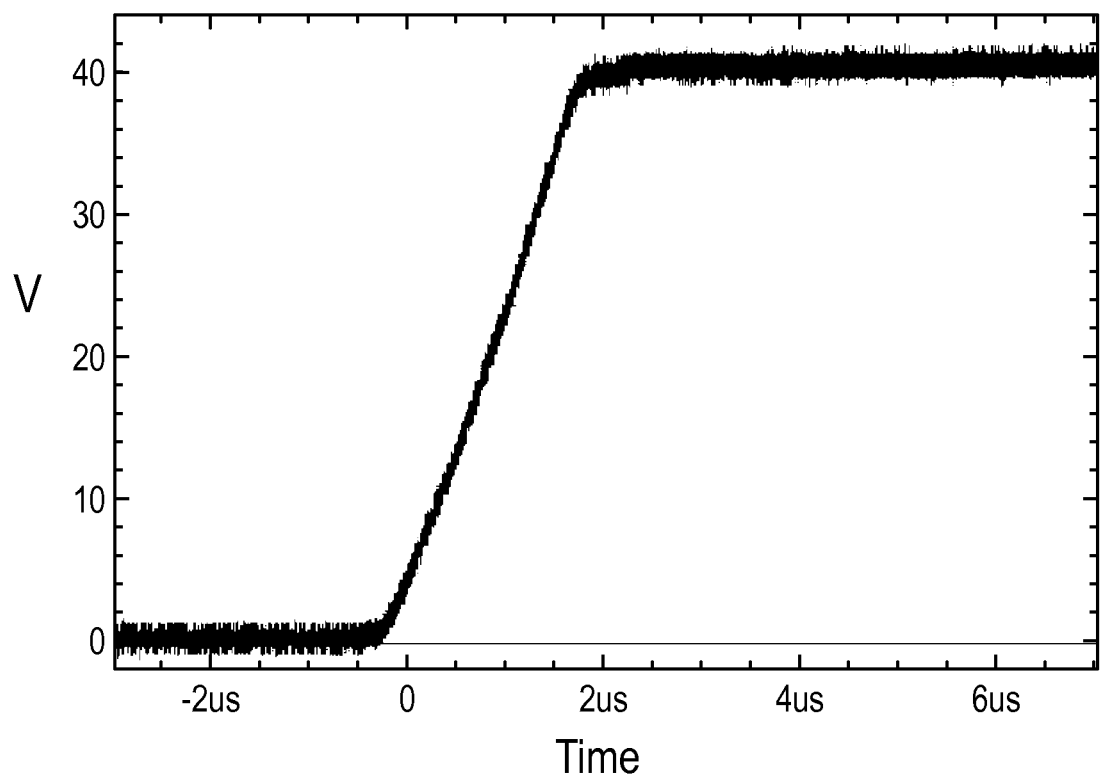
FIG. 10B graphically depicts an example output voltage over time available from the configuration of FIG. 10A.

Another illustration of greater charging efficiency when multiple FEGs are used is seen in FIGS. 10A and 10B. A bank of four FEGs is depicted in the electrical schematic of FIG. 10A, although other numbers of FEGs may be used in a similar arrangement for other embodiments. Circuit 1000 includes FEG 1010, FEG 1020, FEG 1030, and FEG 1040. Each FEG is connected to a respective diode. Specifically, FEG 1010 is connected to diode 1015; FEG 1020 is connected to diode 1025; FEG 1030 is connected to diode 1035; and FEG 1040 is connected to diode 1045. Each diode is connected together and also to a capacitive load 1050. The capacitive load 1050 is also connected via ground to each FEG. The configuration of circuit 1000 enables a high energy output pulse to be sent to the capacitive load 1050. A high voltage probe 1060 at the capacitive load 1050 measures the amount of high voltage available to the capacitive load 1050 from the bank of FEGs. The diodes, (1015, 1025, 1035, and 1045), enable nearly all of the available high voltage from the bank of FEGs to be sent to the capacitive load 1050.

In a working example, the circuit 1000 of FIG. 10A was tested with a 31 nF 75 KV capacitive load. The bank of 5 FEGs charged the capacitive load to approximately 40 KV. The well-known equation of: $(E=\frac{1}{2}CV^2)$ reveals that the circuit 1000 is capable of producing approximately 25 joules of energy. FIG. 10B shows a graphical result of the working example. The graph indicates that the charging efficiency of the bank of 4 FEGs is equivalent to a single FEG charging a 25% smaller capacitive load.

Figure 11:
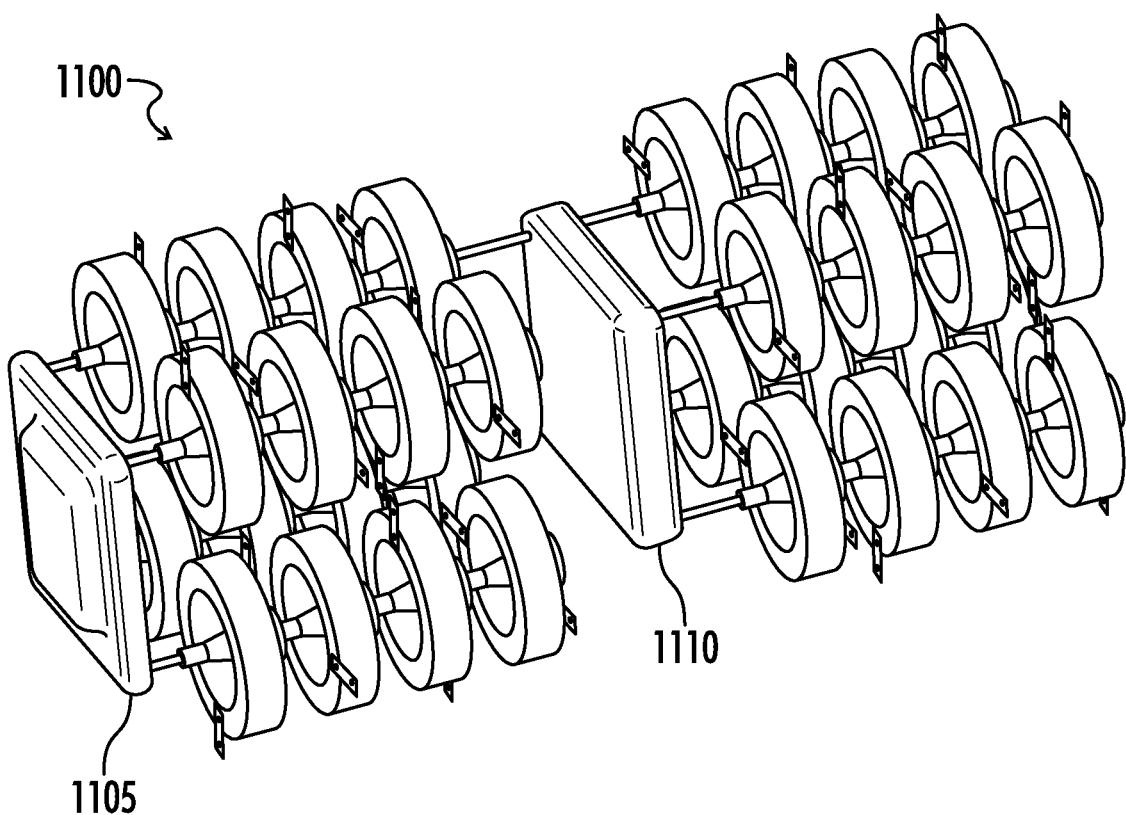
FIG. 11 pictorially illustrates an example modular system of multiple banks of FEGs in accordance with one embodiment of the present disclosure.

The single bank of FEGs shown in FIG. 10A can be expanded to multiple banks of FEGs that would comprise a modular system. FIG. 11 shows a conceptual modular system 1100 of multiple banks of ring FEGs. It is possible to have parallel sets of series FEGs. That is, if a set of four FEGs is insufficient to charge a load completely, another set of four may FEGs may be employed, etc. Accordingly, the modular system 1100 shows that multiple FEG banks may be bussed in parallel and fired sequentially to produce multiple high voltage, high energy pulses. For example, it may be desirable for some load applications to fire four FEGs in parallel, then fire another four FEGs sequentially to produce a series of pulses. In the illustration of FIG. 11, sixteen FEGs may produce a single full magnitude output pulse with a time delay between pulses as a result of the configuration of the explosive train.

The explosive train for the FEGs may be configured in various ways to initiate the explosion based on the application, including using an explosive delay generator that employs a detonator wire or using an electrical timing means for initiating the explosion.

FEG bank 1105 and FEG bank 1110 in FIG. 11 can be customized for voltage, current, and energy. The customization parameters can lead to optimum energy transfer. By optimizing the energy transfer of the multiple banks of FEGs, the modular system 1100 may produce greater than 200 J pulses of energy at tens of kilovolts and thousands of amps for several pulses. In addition, FEG bank 1105 and FEG bank 1110 may also be configured to provide a single high energy pulse by summing the output of all FEG banks within modular system 1100.

Certain radio frequency communication systems may be impacted by a high voltage pulse generator, such as a voltage inversion generator. A description of a voltage inversion generator (VIG) is described in U.S. Pat. No. 7,151,330 B2, entitled "Apparatus and Method for Generating High Voltages Using a Voltage Inversion Generator and Multiple Closed-Path Ferrites" and issued on Dec. 19, 2006 to Millard Franklin Rose, which is incorporated herein by reference. In general, a high voltage pulse generator, when coupled to an FEG, may be configured to deliver single or multiple radio frequency (RF) bursts to disrupt radio communication.

While several embodiments or arrangements have been described in detail, it is to be expressly understood that it will be apparent to persons having skill in the relevant art that these embodiments or arrangements may be modified. Various changes of form, design or arrangement may be made without departing from the scope of the disclosure. Therefore, the above description is to be considered non-limiting. The following claims are considered to encompass the scope of the disclosure.

The invention claimed is:

1. A pulse generating system, comprising:
a latching element coupled to a load;
at least one ferroelectric generator (FEG) for generating a pulse to the load in response to depolarization of the FEG from an explosion that fractures the FEG; and
explosive material for generating the explosion,
wherein the latching element is coupled between the FEG and the load for permitting the pulse to flow through the latching element to the load and for preventing energy of the pulse in the load from being returned to the FEG during fracturing of the FEG, and wherein the latching element is configured to transition to an open circuit state in response to the pulse.

2. The system of claim 1, wherein the latching element is a diode.

3. The system of claim 1, wherein the latching element is a blocking inductor.

4. A pulse generating system, comprising:
a latching element coupled to a load;
at least one ferroelectric generator (FEG) for generating a pulse to the load in response to depolarization of the FEG from an explosion that fractures the FEG; and
explosive material for generating the explosion,
wherein the latching element is coupled between the FEG and the load for permitting the pulse to flow through the latching element to the load and for preventing energy of the pulse in the load from being returned to the FEG during fracturing of the FEG, and wherein the latching element is an explosive wire.

5. The system of claim 1, wherein the pulse has a voltage greater than 10,000 Volts.

6. The system of claim 1, further comprising a plurality of FEGs configured to send multiple high-voltage pulses to the load.

7. A pulse generating system, comprising:
a latching element coupled to a load;
at least one ferroelectric generator (FEG) for generating a pulse to the load in response to depolarization of the FEG from an explosion that fractures the FEG; and
explosive material for generating the explosion,
wherein the latching element is coupled between the FEG and the load for preventing energy of the pulse in the load from being returned to the FEG during fracturing of the FEG, and wherein the latching element is an explosive wire.

8. A pulse generating system, comprising:
a latching element coupled to a load;
at least one ferroelectric generator (FEG) for generating a pulse to the load in response to depolarization of the FEG from an explosion that fractures the FEG; and
explosive material for generating the explosion,
wherein the latching element is coupled between the FEG and the load for permitting the pulse to flow through the latching element to the load and for preventing energy of the pulse in the load from being returned to the FEG during fracturing of the FEG, and wherein the latching element is configured to transition to an open circuit state in response to a voltage of the pulse exceeding a threshold.

\* \* \* \* \*